(12) United States Patent
Strawbridge et al.

(10) Patent No.: US 9,698,076 B1
(45) Date of Patent: Jul. 4, 2017

(54) METAL SLUGS FOR DOUBLE-SIDED COOLING OF POWER MODULE

(71) Applicant: KSR IP Holdings LLC., Wilmington, DE (US)

(72) Inventors: Simon Strawbridge, Swansea (GB); Laird R. Bolt, Halifax (CA)

(73) Assignee: KSR IP Holdings LLC., Wilmington, DE (US)

( * ) Notice: Subject to any disclaimer, the term of this patent is extended or adjusted under 35 U.S.C. 154(b) by 0 days.

(21) Appl. No.: 14/978,669

(22) Filed: Dec. 22, 2015

(51) Int. Cl.
*H01L 23/34* (2006.01)
*H01L 23/373* (2006.01)
*H01L 21/48* (2006.01)
*H01L 29/739* (2006.01)
*H01L 27/06* (2006.01)
*H02M 7/00* (2006.01)

(52) U.S. Cl.
CPC ...... *H01L 23/3735* (2013.01); *H01L 21/4871* (2013.01); *H01L 27/0664* (2013.01); *H01L 29/7397* (2013.01); *H02M 7/003* (2013.01)

(58) Field of Classification Search
CPC .................. H01L 23/3735; H01L 21/4871
USPC ......................................................... 257/720
See application file for complete search history.

(56) References Cited

U.S. PATENT DOCUMENTS

| 5,777,259 | A | 7/1998 | Mennucci et al. |
|---|---|---|---|
| 6,223,815 | B1 | 5/2001 | Shibasaki |
| 6,933,593 | B2 | 8/2005 | Fissore et al. |
| 7,759,778 | B2 | 7/2010 | Lowry et al. |
| 7,961,474 | B2 | 6/2011 | Yoshida et al. |
| 9,088,226 | B2 | 7/2015 | Tompkins et al. |
| 9,148,946 | B1 | 9/2015 | Singh et al. |
| 2010/0053889 | A1 | 3/2010 | Miller et al. |
| 2011/0254177 | A1 | 10/2011 | Malhan et al. |
| 2014/0218871 | A1 | 8/2014 | Kim et al. |

FOREIGN PATENT DOCUMENTS

EP  0660383 A1  6/1995

OTHER PUBLICATIONS

Search Report for International Application No. PCT/US2016/068295, dated Apr. 10, 2017, 3 pp.

*Primary Examiner* — Anthony Ho
(74) *Attorney, Agent, or Firm* — Dinsmore & Shohl LLP

(57) ABSTRACT

A power module for converting direct current to alternating current, the power module including: a semiconductor switching circuit device, a substrate onto which said switching circuit device is physically and electrically coupled, at least one secondary substrate with the semiconductor switching circuit device being physically and electrically coupled to the at least one secondary substrate such that the semiconductor switching circuit device is formed between the substrate and the at least one secondary substrate, at least one thermal mass attached to a respective secondary substrate of the at least one secondary substrate, and a cover at least partially disposed about said power module, said cover including an opening exposing a bottom side of the substrate.

15 Claims, 6 Drawing Sheets

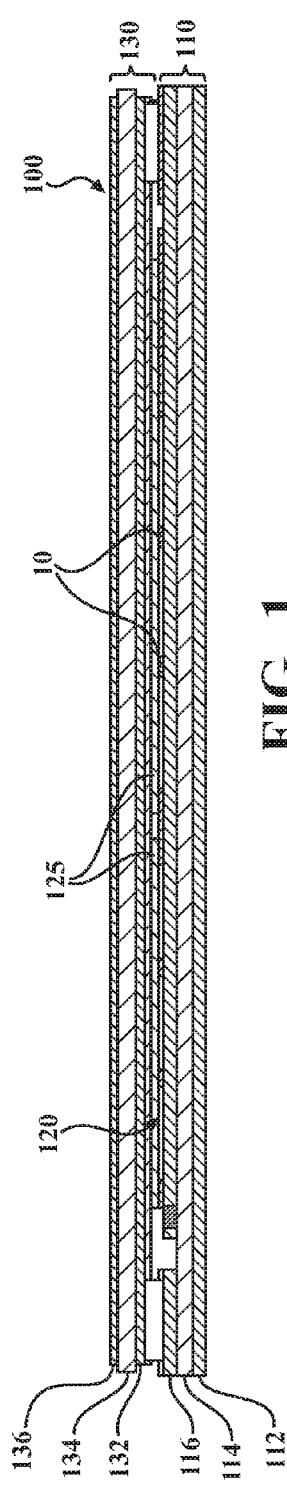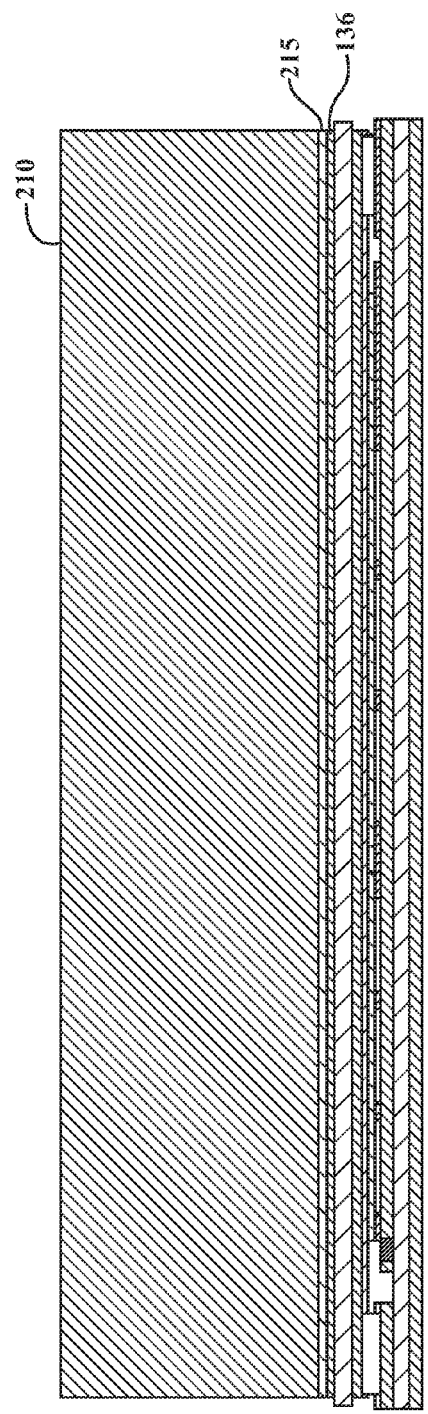

METAL SLUGS FOR DOUBLE-SIDED COOLING OF POWER MODULE

FIELD OF THE INVENTION

This invention relates to a power module for converting high voltage direct current (DC) to high voltage alternating current (AC), such as, but not necessarily limited to, power modules used in hybrid vehicles and purely electric vehicles.

BACKGROUND OF THE INVENTION

In the past, power modules for hybrid or electric automobiles have often provided cooling on a single side of an electronic device, such as a power MOSFET (metal oxide semiconductor field effect transistor), IGBT (insulated gate bipolar transistor), or other component. Due to the placement of such power modules on heat sinks, lead frame terminals of such devices may come in close proximity to the heat sinks. Further, past power modules typically have used wire bonds to one or more sides of the power module device. The use of wire bonds creates problems with high assembly time and capital equipment costs, as well as high parasitic inductances that cause voltage overshoots. Still further, wire bonds can lead to failures due to repetitive power cycling.

However, in practice, it can be difficult to achieve double-sided cooling due to mechanical tolerances of the various components making up the power module. Such modules with double-sided cooling may include two DBC (direct bond copper) substrates, each made up of two copper layers and a ceramic layer, and each with a thickness tolerance, two solder layers and a power semiconductor device sandwiched between the two DBC substrate layers. Required tolerances on power module thicknesses can make it difficult to provide heat sinking, especially if trying to heat sink two adjacent devices, each with their own thickness and flatness tolerances.

SUMMARY OF THE INVENTION

Exemplary embodiments of the present invention provide a thermal mass with good thermal conductivity that is added to a power module to improve double-sided cooling. These and other features provide a power module with improved transient thermal performance and lowered thermal impedance (bottom side cooling).

According to an aspect of the present invention, a power module for converting direct current to alternating current comprises a semiconductor switching circuit device, a substrate onto which the semiconductor switching circuit device is physically and electrically coupled, at least one secondary substrate with the semiconductor switching circuit device being physically and electrically coupled to the at least one secondary substrate such that the semiconductor switching circuit device is formed between the substrate and the at least one secondary substrate, and a cover. The cover includes an opening exposing a bottom side of the substrate. The semiconductor switching circuit device is also coupled to the substrate and to the at least one secondary substrate by a soldered or a sintered connection. A thermal mass is also added above each of the at least one secondary substrate. A thermal mass may be attached to a corresponding upper surface of each of the at least one secondary substrate using a thermally conductive layer. A thermal mass may also be attached to an upper surface of a secondary substrate using a variety of other methods, such as thermally conductive adhesive, solder, sintering and laminated foils.

In particular embodiments the cover is disposed over a top side of the power module and includes at least one cover aperture exposing a top side of a thermal mass attached to a corresponding secondary substrate. The cover may also include a plurality of cover apertures with each cover aperture exposing a top side of a respective thermal mass that is attached to a corresponding secondary substrate.

According to other aspects of the invention, the semiconductor switching circuit device includes at least one switching circuit, each at least one switching circuit comprising an insulated gate bipolar transistor and a diode. The substrate and/or secondary substrate may include a ceramic layer having a top side and a bottom side, a first copper layer coupled to said top side of said ceramic layer, and a second copper layer coupled to said bottom side of said ceramic layer. Alternatively, the substrate and/or secondary substrate may include a copper layer, an aluminum oxide layer, and an aluminum plate, with said aluminum oxide layer being formed on said aluminum base plate and said copper layer being applied over said aluminum oxide layer. A thermal mass is therefore attached to a top side of a first copper layer of a secondary substrate.

According to still other aspects of the invention, each switching circuit of the semiconductor switching circuit device is physically and electrically coupled to the substrate and to a corresponding second substrate, such that a plurality of switching circuits are physically and electrically coupled to the substrate and to corresponding second substrates.

According to still other aspects of the invention, the at least one cover aperture in the cover is formed by a process whereby a portion of a top surface of the cover is subjected to a grinding process to remove a portion of the cover and to reveal a top surface of the at least one thermal mass, such that each cover aperture reveals a corresponding thermal mass.

A power module for converting direct current to alternating current includes a semiconductor switching circuit device, a substrate, at least one secondary substrate, and may be employed with a cooling unit. The switching device may include one or more MOSFETs, IGBTs, or other suitable switching components, including die-up or flip-die IGBTs. The cooling unit may be physically coupled to the switching circuit device and the substrate and secondary substrate by way of a pressure fit, with the cooling unit including a first portion and a second portion spaced away from the first portion wherein the first and second portions are adapted to sandwich the substrate, switching circuit device, and secondary substrate therebetween. The first and second portions of the cooling unit may include hollow cavities adapted to allow a cooling liquid to flow therethrough. The switching circuit device may include a plurality of insulated gate bipolar transistors and diodes. The module may be constructed such that no separate fasteners are used to couple the cooling unit to the substrate, switching circuit device, and secondary substrate. The first portion of the cooling unit may make contact with a top side of a secondary substrate attached to a switching circuit of the semiconductor switching circuit device at a location aligned with the switching circuit inside the semiconductor switching circuit device, and the second portion of the cooling unit may make contact with a bottom side of the substrate that is aligned with the first portion.

These and other objects, advantages, purposes, and features of this invention will become apparent upon review of the following specification in conjunction with the drawings.

BRIEF DESCRIPTION OF THE DRAWINGS

FIG. 1 is a cross-section view of the power module of FIG. 1 without molding or copper slugs;

FIG. 2 is a cross-section view of the power module of FIG. 1 with a copper slug;

DETAILED DESCRIPTION OF THE PREFERRED EMBODIMENTS

The present invention will now be described with reference to the accompanying figures, wherein the numbered elements in the following written description correspond to like-numbered elements in the figures.

As discussed in detail herein, a thermal mass (also referred to as a slug) with good conductivity (e.g., plated or unplated copper) attached to a top surface of a top DBC (direct bonded copper) substrate layer in a power module improves transient thermal performance and lowers thermal impedance (bottom side cooling). In addition, as also discussed herein, if a post-mold grinding or milling operation is used, it is possible to achieve a consistent module thickness and flatness, which facilitates efficient double-sided cooling.

Exemplary embodiments of the present invention provide processes that improve these metrics without affecting the cooling path through the bottom of the power module (bottom side cooling). As described herein, a thermal mass may be added by means of a thermally conductive attachment to a back copper plane of the uppermost DBC substrate. As also discussed herein, the exemplary thermal mass needs to have a good heat capacity and a high thermal conductivity. Copper is an example of a suitable material, however, other substances may be used.

A portion of a power module 100 according to one embodiment of the present disclosure, is illustrated in FIG. 1. The exemplary power module 100 may be used to implement a switching circuit 120 which may be used in a variety of different applications. Such applications may include the conversion of DC electricity to AC electricity inside of either a purely electric vehicle, or a hybrid vehicle. An AC electrical output from a power module 100 may be used in powering an AC motor inside a vehicle, or which may be used to power other components of a vehicle, as well as in non-vehicle applications. Exemplary power modules are discussed in detail in U.S. patent application Ser. No. 13/880,553, titled "POWER MODULE FOR CONVERTING DC TO AC," by James D. Tomkins, dated Oct. 19, 2011, which is herein incorporated by reference.

Figure 14:
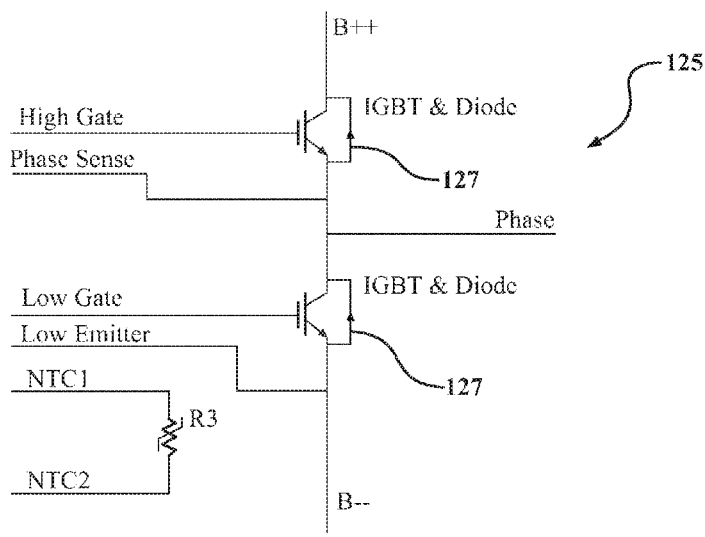
FIG. 14 is a schematic diagram of a semiconductor switching circuit device.

In various embodiments, a power module 100 may comprise a plurality of switching circuits 120. In one embodiment, a power module 100 may comprise four switching circuits 120. Other embodiments may also include other quantities of switching circuits 120. In one embodiment, also illustrated in FIG. 1, an exemplary switching circuit 120 comprises one or more switching modules 125, which may also be referred to as power silicon members 125. In one embodiment as shown in FIG. 14, power silicon members 125 are insulated gate bipolar transistors (IGBTs) and diodes 127. Each switching circuit 120 or switching module 125 may be a commercially available switching circuit marketed by companies such as International Rectifier of El Segundo, Calif.

FIG. 1 also illustrates the layered construction of an exemplary power module 100 that is assembled in a "thermal stack." As illustrated in FIG. 1, the power module 100 comprises a primary substrate 110, a switching circuit 120, a secondary substrate 130, and various solder connections 10.

Transient thermal impedance (Zth) and steady state thermal impedance (Rth) are key metrics in the design of a power module. The primary substrate 110 includes an outer copper layer 112, a central ceramic layer 114, and an inner discontinuous copper layer 116, with primary substrate 110 thus comprising a direct bonded copper ("DBC") substrate. Correspondingly, secondary substrate 130 comprises an outer copper layer 136, a central ceramic layer 134, and an inner copper layer 132 such that secondary substrate 130 also comprises a DBC substrate. As also illustrated in FIG. 1, between substrates 110 and 130 are positioned power silicon members 125, such as either an IGBT or a diode, with various solder connections 10 formed between the substrates 110 and 130 and the power silicon members 125.

In one embodiment, solder connections 10 may alternatively be sintered connections. The use of sintered connections, such as silver based sintering, provides higher melt temperatures relative to soldered connections 10. Sintering, thus, provides a greater delta difference relative to the operating temperatures of the switching devices 120 and, in turn, may increase reliability in view of the cyclic temperature cycling of the power module 100 in operation. Further still, formation of sintered connections 10 via a sintering process employing the applications of both temperature and pressure may be used to promote flatness of switching devices 120.

FIG. 2 illustrates a power module 100, with an added thermal mass or slug 210 in accordance with a feature of the present invention. As illustrated in FIG. 2, the thermal mass or slug 210 may be attached to the outer copper layer 136 of the secondary DBC substrate 130 using a thermally conductive layer 215. A thermally conductive layer 215 may include thermally conductive adhesives, soldering, sintering, and laminated foils. A type of material used for the thermal mass/slug 210 and the material 215 of the thermally conductive layer used in the attachment process will determine whether a plating of the DEC substrate copper layer 136 and/or mating surface of the slug 210 is required. For example, if a silver epoxy is used as a thermal adhesive, then silver plating of the DBC substrate's copper layer 136 and of the copper slug 210 would be required. It is important to minimize the thickness of the thermally conductive layer 215 to improve the thermal impedance between the DBC substrate copper layer 136 and the copper slug 210. A size and thickness may be varied to meet application needs and budget.

Figure 3:
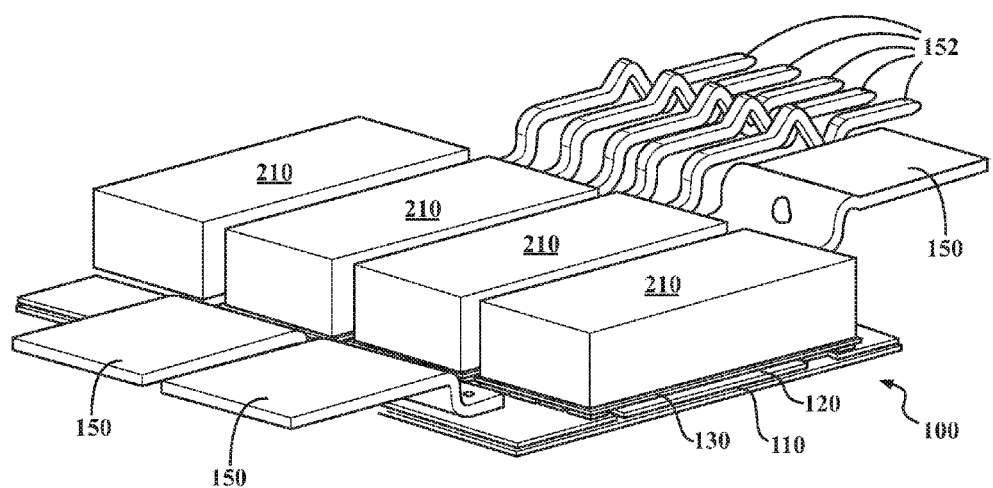
FIG. 3 is an isometric view of the power module of FIG. 2 without molding.

In one embodiment, as illustrated in FIG. 3, a power module 100 comprises four switching circuits 120 sandwiched between the substrate 110 and four corresponding secondary substrates 130. FIG. 3 also illustrates that each secondary substrate 130 is also paired with a respective copper mass/slug 210. While a single copper mass 210 may be placed above the four switching circuits 120 for thermal cooling, irregularities in the soldering connections 10 and in the power silicon members 125 themselves may result in one or more DBC substrate copper layers 136 not making adequate contact with the single thermal mass/slug 210. Instead, by using individual thermal masses/slugs 210, each thermal mass/slug 210 need only deal with a single DBC substrate (and its individual height and planarity irregularities), and would therefore ameliorate issues related to variations in the other components of the other thermal stacks. The power module also includes lead frame terminals 150 and 152. Lead frames may be joined to the primary substrate 110 in various manners such as laser welding, ultrasonic welding, and by sintering. The lead frames include power leads associated with the battery terminals and circuit elements of the power module.

Figure 5:
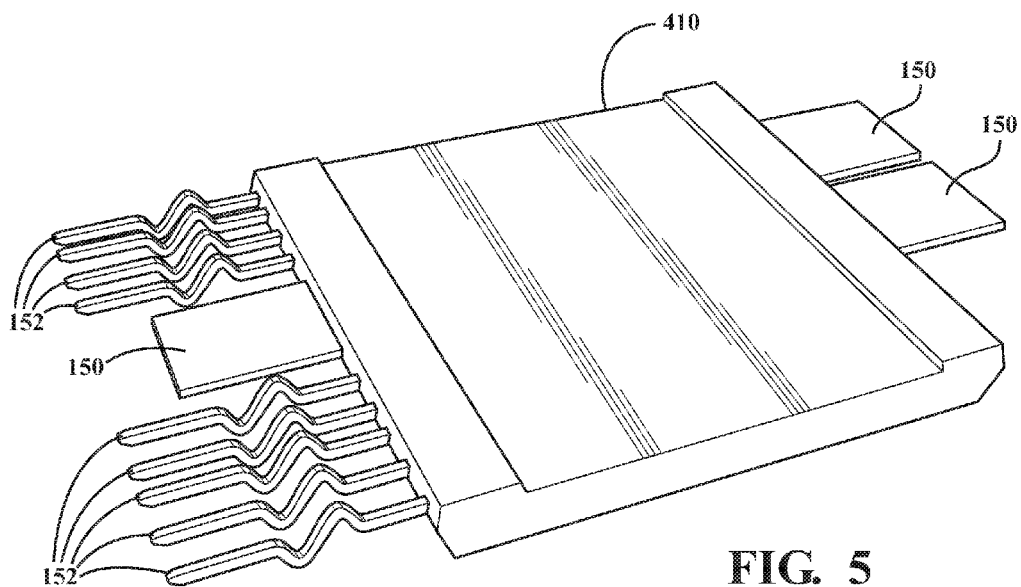
FIG. 5 is an isometric view of the power module of FIG. 4 without top side grinding.
Figure 4:
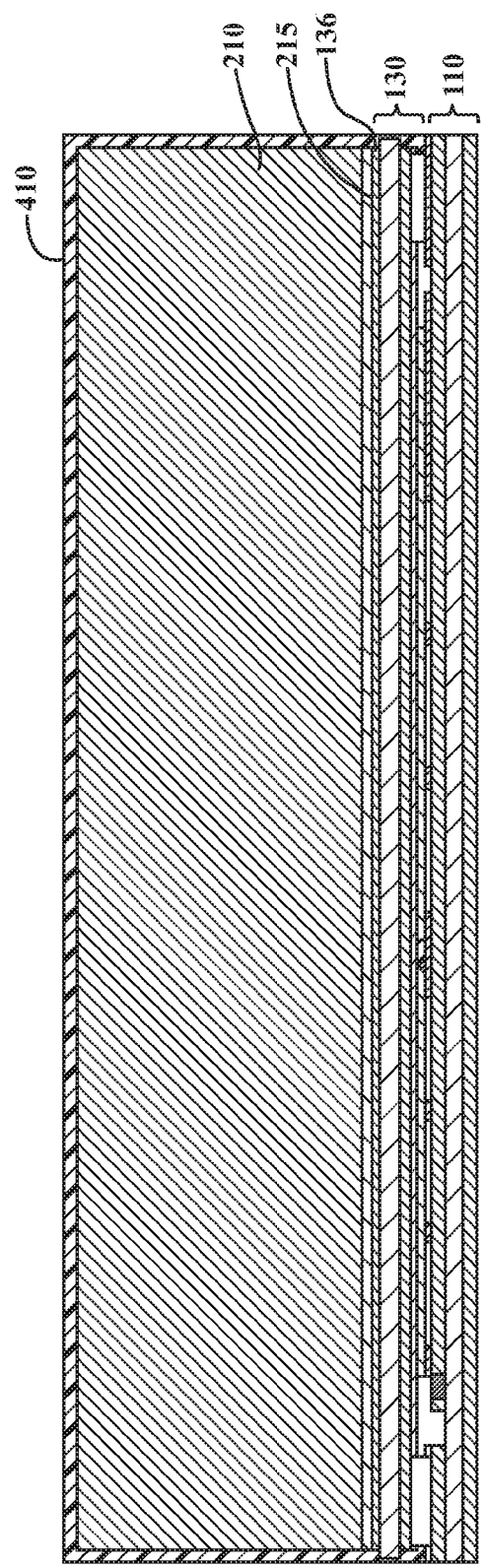
FIG. 4 is a cross-section view of the power module of FIG. 2 with copper slug and molding.
Figure 6:
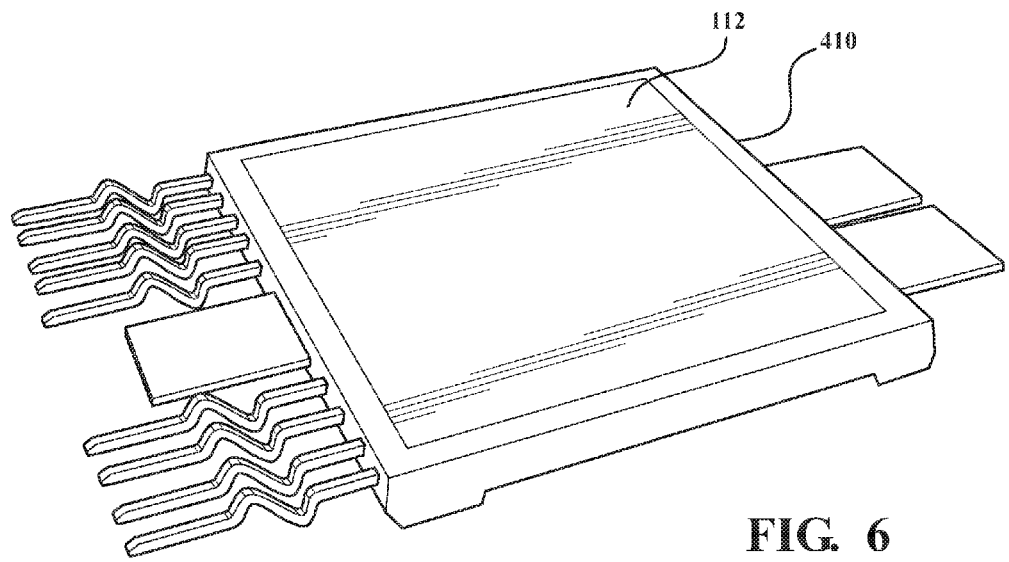
FIG. 6 is an isometric view of the power module of FIG. 5 showing an exposed back side copper layer.

FIGS. 4 and 5 illustrate an embodiment of the power module 100 illustrated in FIGS. 2 and 3 with the addition of an over molded plastic cover 410 encapsulating or covering a side or portion of the slugs 210. In one embodiment, the molded plastic cover 410 may be made as thin as possible. The power module 100 illustrated in FIGS. 4 and 5 may be used with single-sided cooling operations. As illustrated in FIG. 6, the underside of the power module 100 will not be encased by the plastic molded cover 410. The molded power module 100 illustrated in FIG. 6 may be placed onto a heat sink through the exposed outer copper layer 112 of the substrate 110. The use of such heat sinks are discussed in detail by James D. Tomkins in the previously incorporated U.S. patent application, titled, "POWER MODULE FOR CONVERTING DC TO AC."

Figure 7:
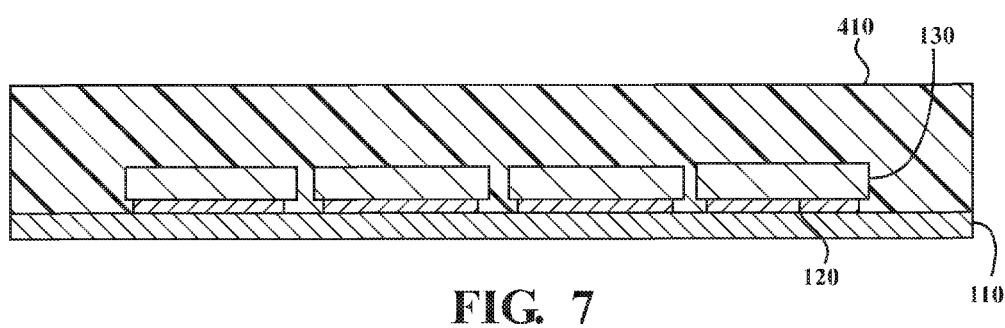
FIG. 7 is a simplified cross-section view of an over-molded power module that contains no copper slugs.
Figure 8:
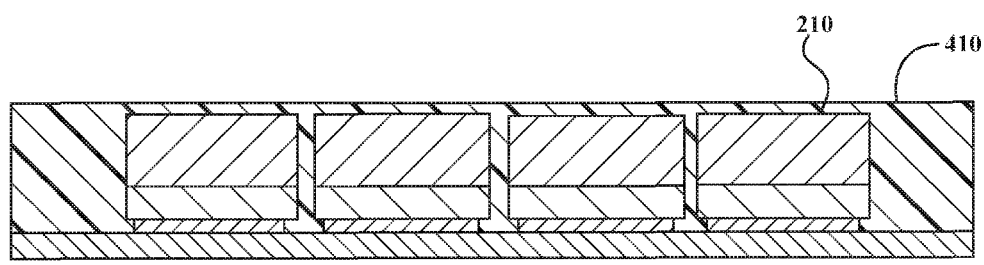
FIG. 8 is a simplified cross-section view of the over-molded power module that contains copper slugs.

FIGS. 7 and 8 illustrate simplified cross-sectional views of over-molded power modules. In FIG. 7, the power module does not contain a thermal mass/slug 210 and therefore contains a thicker layer of plastic over the secondary DBC substrate 130. Such an embodiment may be used, when only single-sided cooling is desired. Since double-sided cooling isn't desired, the additional thermal mass/slug 210 may be omitted. However, similar to the embodiment illustrated in FIG. 4, a thermal mass/slug 210 may be attached to the outer copper layer 136 of the secondary DBC substrate 130, as illustrated in FIG. 8. As illustrated in FIGS. 4 and 8, a thickness of the thermal mass/slug 210 may be selected such that the thickness of the cover 410 over the thermal mass/slug 210 will be relatively thin. In one embodiment, the height of the cover 410 over the power module 100 will be the same height as that in FIG. 7 so that either embodiment (with and without thermal mass/slug 210) will have the same package height. In one embodiment, by molding the plastic cover 410 to be as thin as possible over the thermal mass/slug 210, the thermal mass/slug 210 may be as thick as possible (while still providing for a uniform thickness of the power module 100).

Figure 9:
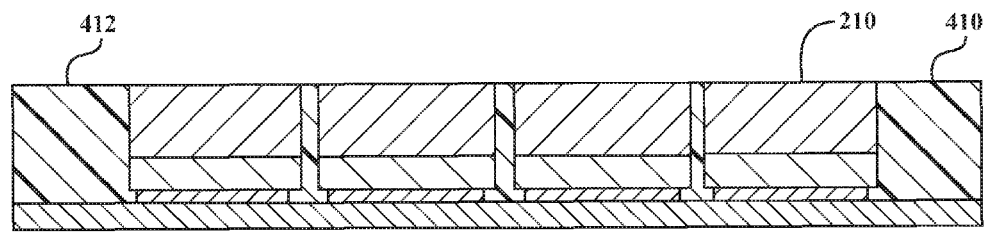
FIG. 9 is a simplified cross-section view of the over-molded power module of FIG. 8 after milling to expose the copper slugs.
Figure 10:
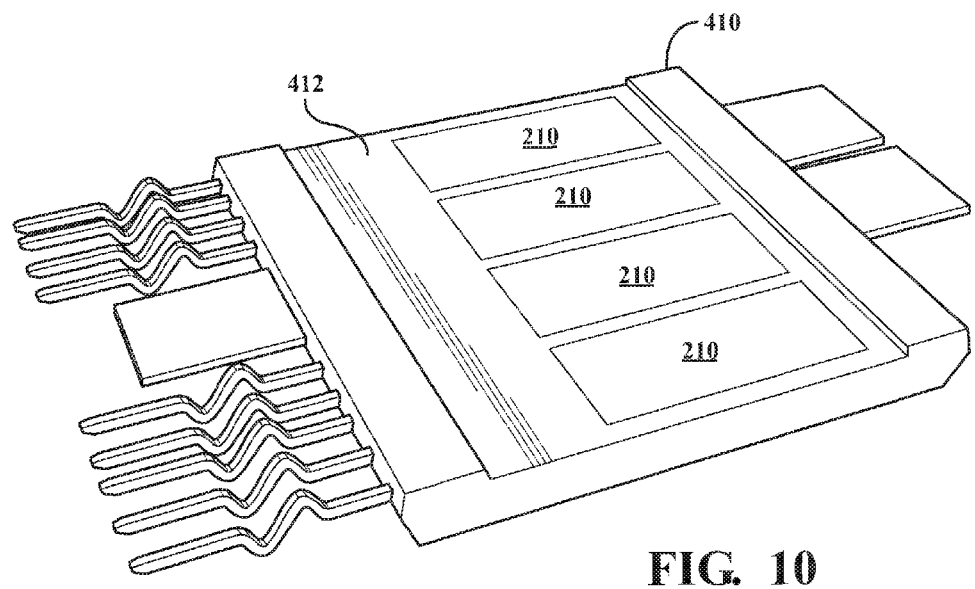
FIG. 10 is an isometric view of the power module of FIG. 5 with top side grinding to expose copper slugs.

As illustrated in FIGS. 9 and 10, when double-sided cooling of the power module 100 is desired, a top surface 412 of the molded plastic cover 410 may be subjected to a grinding or milling operation to remove a portion of the molded plastic cover 410 over the thermal mass/slugs 210, to reveal the thermal mass/slugs 210, such that the heat sink discussed herein may be coupled to the exposed thermal mass/slugs 210 for double-sided cooling of the power module 100.

Figure 11:
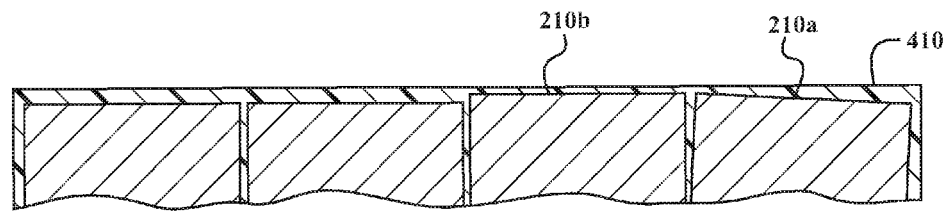
FIG. 11 is a simplified cross-section view of a portion of an over-molded power module that contains copper slugs with irregularities in height and planarity.

As illustrated in FIG. 11, one of the problems that must be contended with when double-sided cooling is desired is the ability to attach a heat sink to both the top and the bottom of the power module 100, where such double-sided cooling results in mechanical structures contacting components on both sides of the power module 100. For optimal cooling efficiency, there are necessarily very tightly controlled soldering and assembly parameters to realize the desired module thickness and planarity requirements. Such module thickness and planarity requirements may be very difficult to consistently achieve. As illustrated in FIG. 11, the two thermal masses/slugs 210 on the right side of the figure have irregularities in height and/or planarity. For the sake of illustration and clarity, the structures illustrated are simplified and not drawn to scale. While such irregularities are not seen when only single-sided cooling is desired (and the molded plastic cover 410 is intact), the irregularities would be exposed when the top surfaces of the thermal masses/slugs 210 are exposed for double-sided cooling.

Figure 12:
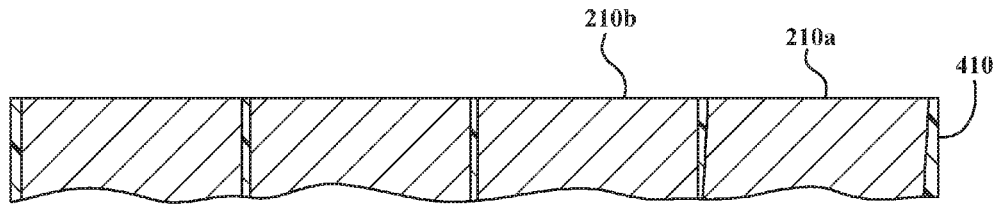
FIG. 12 is a simplified cross-section view of a portion of the over-molded power module of FIG. 11 with exposed copper slugs after a grinding operation to remove irregularities.

In one embodiment, to ensure that thickness and planarity requirements are able to be met when double-sided cooling is to be performed during a grinding or milling operation, a portion of the molded plastic cover 410 may be removed during the grinding/milling operation as well as milling/grinding a portion of the thermal masses/slugs 210 such that the irregularities are removed whereby the exposed surfaces are substantially planar with regard to each other. For example, as illustrated in FIG. 11, if a thermal mass/slug 210a were attached to an outer copper layer 136 of a secondary DBC substrate 130 with a thicker solder joint at one end than on the other, the thermal mass/slug 210a would be titled. As also illustrated in FIG. 11, if a thermal mass/slug 210b were attached to a thermal stack of a secondary DBC substrate, switching circuit and DBC substrate with an irregular height, the thermal mass/slug 210b would have an irregular height when compared to the other thermal masses/slugs 210. As illustrated in FIG. 12, during the grinding/milling operation that could be used to remove the portion of the molded plastic cover over the thermal masses/slugs 210, the grinding/milling operation may also be used to remove height and planarity irregularities.

As illustrated in FIGS. 9 and 12, even when thickness and planarity irregularities are present in a power module 100, the grinding/milling operation can be used to remove the thickness and planarity irregularities, such that a desired power module height and planarity (with respect to the underside of the power module 100) can be realized. As illustrated in FIG. 12, after the grinding/milling operation, a desired height and planarity regularity can be achieved. As noted above, for the sake of clarity, the structures are simplified and not drawn to scale.

Figure 13:
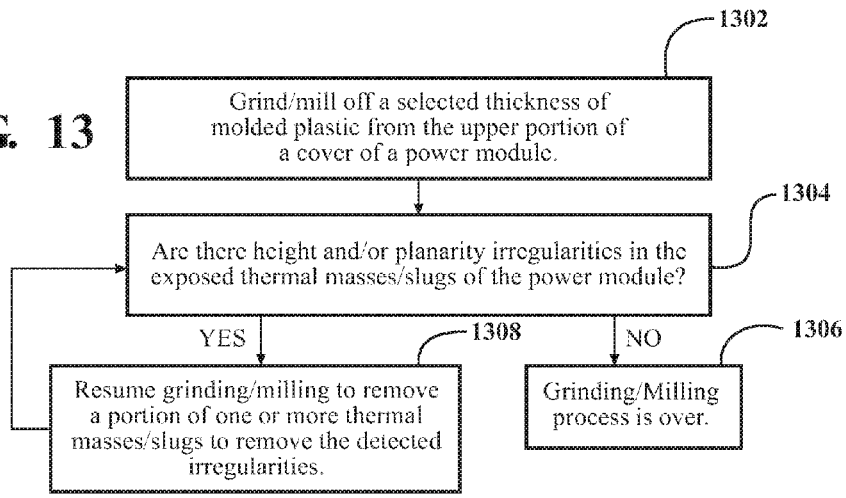
FIG. 13 is a flow diagram of the steps to a computer implemented process for grinding a power module cover to expose thermal slugs and to remove height/planarity irregularities for double-sided cooling of the power module.

FIG. 13 illustrates an exemplary flow diagram for a grinding/milling process for when a power module 100, such as illustrated in FIGS. 4 and 8 (that contain thermal masses/slugs 210), is to be used with double-sided cooling.

As discussed herein, and illustrated in FIGS. 11 and 12, an exemplary grinding/milling operation/process may be used to remove any height/planarity irregularities of the thermal masses/slugs 210 of the power module 100.

In step 1302 of FIG. 13, when a power module 100 is to be used with double-sided cooling, a grinding/milling operation/process is used to remove a selected thickness of molded plastic from an upper portion of the cover 410 of the power module 100. In one embodiment, a selected thickness of molded plastic to be removed may be defined by an average thickness of the molded plastic over the thermal masses/slugs 210.

In step 1304 of FIG. 13, when the initial grinding/milling is completed, a determination is made as to whether there are any height and/or planarity irregularities in the exposed thermal masses/slugs 210 of the power module 100. In one embodiment, the initial grinding/milling will remove the layer of molded plastic of the cover 410 over the thermal masses/slugs 210. When there are no detected height or planarity irregularities in the exposed thermal masses/slugs 210 of the power module 100, the process continues on to step 1306 of FIG. 13 and the grinding/milling process is complete.

When there are detected height and/or planarity irregularities in the exposed thermal masses/slugs 210 of the power module 100, the process continues on to step 1308 of FIG. 13. In step 1308 of FIG. 13, a second grinding/milling operation/process is performed to remove a portion of one or more thermal masses/slugs 210 to remove any detected irregularities in the exposed thermal masses/slugs 210 of the power module 100. In one embodiment, the amount of additional grinding/milling is defined by detected height and/or planarity irregularities. After the additional grinding/milling operation/process has completed, the process continues back to step 1304 of FIG. 13 for a determination as to whether there are still height/planarity irregularities in the exposed thermal masses/slugs 210 of the power module 100. In one embodiment, steps 1308 and 1304 may be repeated several times.

Changes and modifications in the specifically described embodiments can be carried out without departing from the principles of the present invention which is intended to be limited only by the scope of the appended claims, as interpreted according to the principles of patent law including the doctrine of equivalents.

The invention claimed is:

1. A power module for converting direct current to alternating current, said power module comprising:
   a semiconductor switching circuit device;
   a primary substrate onto which said switching circuit device is physically and electrically coupled;
   at least one secondary substrate with the semiconductor switching circuit device being layered over the semiconductor switching device and the primary substrate, the at least one secondary substrate being physically and electrically coupled to the at least one secondary substrate such that the semiconductor switching circuit device is formed between the primary substrate and the at least one secondary substrate;
   at least one thermal mass attached to a respective secondary substrate of the at least one secondary substrate; and
   a cover at least partially disposed about said power module, said cover including an opening exposing a bottom side of the primary substrate.

2. The power module of claim 1, wherein the semiconductor switching circuit device comprises a plurality of switching devices.

3. The power module of claim 2, wherein the power module comprises a plurality of secondary substrates such that each secondary substrate of the plurality of secondary substrates is attached to a respective switching device of the plurality of switching devices.

4. The power module of claim 3 further comprising a plurality of thermal masses such that a thermal mass is attached to each secondary substrate of the plurality of secondary substrates.

5. The power module of claim 4, wherein the cover is disposed over a top side of the power module and includes a plurality of cover apertures, each exposing a top side of a thermal mass attached to a respective secondary substrate.

6. The power module of claim 1, wherein each thermal mass of the at least one thermal mass is attached to a corresponding upper surface of the at least one secondary substrate using a thermally conductive layer.

7. The power module of claim 1, wherein a thermal mass is attached to an upper surface of a secondary substrate through the use of a thermally conductive adhesive, a soldered or sintered connection, or laminated foils.

8. The power module of claim 1, wherein said semiconductor switching circuit device is coupled to said primary substrate and said secondary substrate by a soldered or sintered connection.

9. The power module of claim 1, wherein said cover includes at least one cover aperture, wherein a cover aperture of the at least one cover aperture exposes a top side of a thermal mass attached to a respective secondary substrate of the at least one secondary substrate.

10. The power module of claim 1, wherein the semiconductor switching circuit device comprises at least one switching circuit, each at least one switching circuit comprising an insulated gate bipolar transistor and a diode.

11. The power module of claim 10, wherein each switching circuit of the at least one switching circuit is physically and electrically coupled to the primary substrate and to a corresponding second substrate, such that a plurality of switching circuits are physically and electrically coupled to the substrate and to a corresponding second substrate.

12. The power module of claim 1, wherein the primary substrate and secondary substrate each comprise a ceramic layer having a top side and a bottom side, a first copper layer coupled to said top side of said ceramic layer and a second copper layer coupled to said bottom side of said ceramic layer, such that a thermal mass is attached to a top side of a first copper layer of a secondary substrate.

13. The power module of claim 1, wherein each thermal mass of the at least one thermal mass is attached to a corresponding upper surface of the at least one secondary substrate using a thermally conductive layer.

14. A power module for converting direct current to alternating current, said power module comprising:
   a plurality of semiconductor switching circuit devices;
   a primary substrate onto which said switching circuit device is physically and electrically coupled;
   a plurality of secondary substrates with such that each secondary substrate of the plurality of secondary substrate semiconductor switching circuit device is attached to a respective switch device such that the semiconductor switching circuit device is formed between each primary substrate and the respective secondary substrate;

at least one thermal mass attached to a respective secondary substrate of the at least one secondary substrate; and a cover at least partially disposed about said power module, said cover including an opening exposing a bottom side of the primary substrate.

15. The power module of claim 14 further comprising a plurality of thermal masses such that a thermal mass is attached to each secondary substrate of the plurality of secondary substrates.

* * * * *